United States Patent
Hagen

(10) Patent No.: US 7,088,009 B2
(45) Date of Patent: *Aug. 8, 2006

(54) WIREBONDED ASSEMBLAGE METHOD AND APPARATUS

(75) Inventor: Deborah A. Hagen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 214 days.

This patent is subject to a terminal disclaimer.

(21) Appl. No.: 10/644,163

(22) Filed: Aug. 20, 2003

(65) Prior Publication Data

US 2005/0040501 A1 Feb. 24, 2005

(51) Int. Cl.
*H01L 23/12* (2006.01)

(52) U.S. Cl. .................................... 257/786
(58) Field of Classification Search ............. 257/735, 257/773, 786
See application file for complete search history.

(56) References Cited

U.S. PATENT DOCUMENTS

| | | | |
|---|---|---|---|
| 5,153,379 A | 10/1992 | Guzuk et al. | |
| 5,166,772 A | 11/1992 | Soldner et al. | |
| 5,406,117 A | 4/1995 | Dlugokecki et al. | |
| 6,285,573 B1 | 9/2001 | Park | |
| 6,521,978 B1 | 2/2003 | Fenk et al. | |
| 6,534,706 B1 | 3/2003 | Rapp et al. | |
| 6,538,336 B1 | 3/2003 | Secker et al. | |
| 6,608,390 B1* | 8/2003 | Beatson et al. | 257/784 |
| 6,870,255 B1* | 3/2005 | Teig et al. | 257/700 |
| 6,956,286 B1* | 10/2005 | Kuzawinski et al. | 257/700 |
| 2002/0080593 A1 | 6/2002 | Tsuge et al. | |
| 2003/0029635 A1* | 2/2003 | Anthony et al. | 174/255 |
| 2004/0195591 A1* | 10/2004 | Gehman et al. | 257/202 |

* cited by examiner

*Primary Examiner*—W. David Coleman
(74) *Attorney, Agent, or Firm*—Michael J. Balconi-Lamica; Susan C. Hill

(57) ABSTRACT

A system (10) is disclosed having a circuit portion (18,26, 36) containing more than electrical conductors and a wirebonded assemblage (12,14,16) overlying the circuit portion (18,26,36). The wirebonded assemblage (12,14,16) comprises a plurality of wirebonded wires ((50,52),(60,64),(66, 68)), each of the plurality of wirebonded wires being electrically coupled. The wirebonded assemblage (12,14,16) provides electrical shielding for the circuit portion (18,26, 36). In one embodiment, the wirebonded assemblage provides for heat spreading.

19 Claims, 3 Drawing Sheets

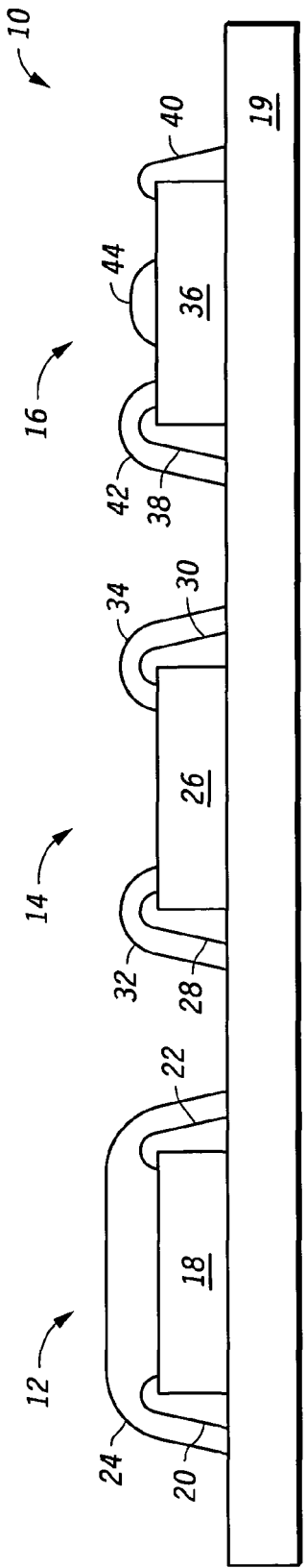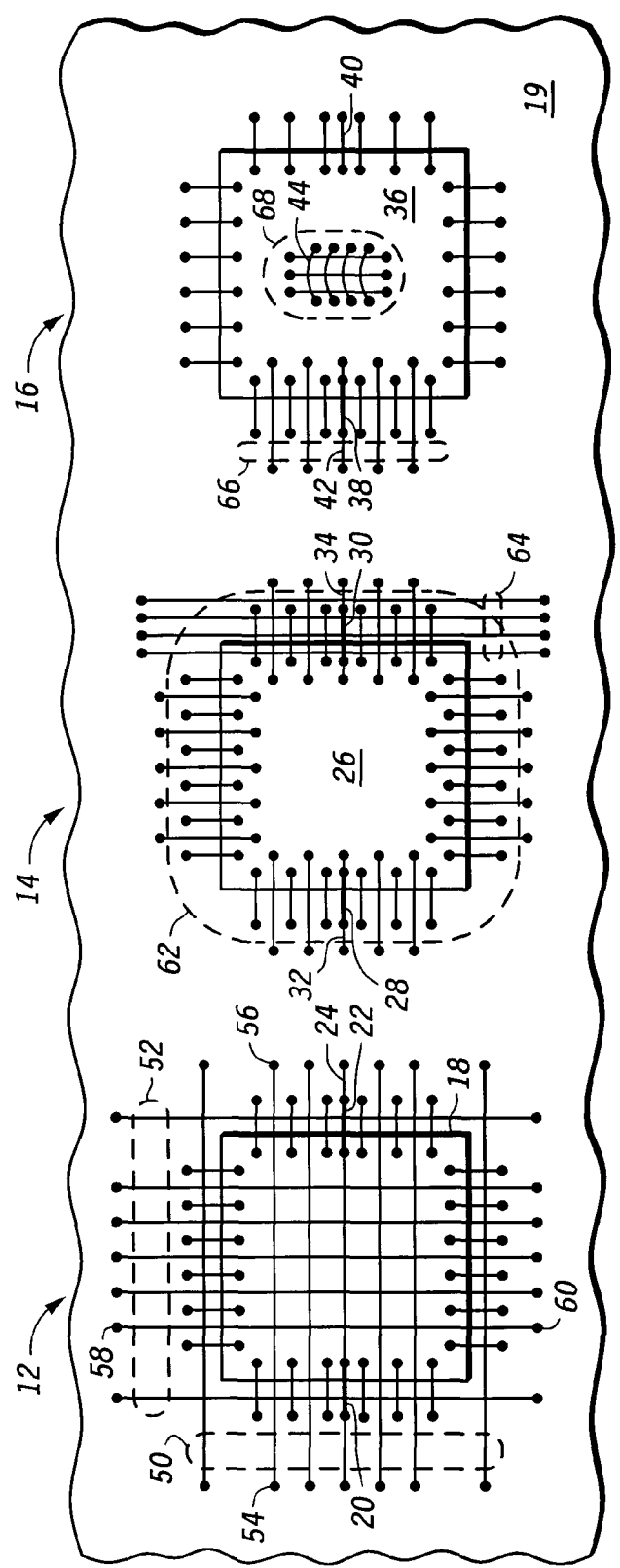

WIREBONDED ASSEMBLAGE METHOD AND APPARATUS

BACKGROUND

1. Field of the Invention

The present disclosure, generally, relates to semiconductor devices and a method of making the same, and more particularly, to a wirebonded assemblage method and apparatus.

2. Related Art

Electromagnetic shielding for radio frequency (RF) or other high frequency packages or modules is becoming more of a significant issue as operating frequencies increase. The traditional path of using externally attached "cages" around a packaged integrated circuit (IC) is cost-effective; however, as integration of various chips into a module increases, localized shielding between ICs within a package or even shielding of various portions of the IC will become more of a problem.

Various techniques or methods are known which attempt to address this problem. The techniques include usage of existing external metal cap structures or metal mesh cap structures, "conductive" encapsulation structures, and metal structures attached or integrated into the outside of a packaged IC. However, such techniques do not provide the most cost effective approach, nor do they easily facilitate shielding of smaller geometries inside of a package, but rather are confined to the outside of a package.

Accordingly, it would be desirable to provide a method for electromagnetic shielding, as well as heat spreading, that overcomes these and other problems in the art.

SUMMARY

According to one embodiment, a system includes a circuit portion containing more than electrical conductors and a wirebonded assemblage overlying the circuit portion. The wirebonded assemblage comprises a plurality of wirebonded wires, each of the plurality of wirebonded wires being electrically coupled. The wirebonded assemblage provides electrical shielding for the circuit portion. The wirebonded assemblage can also provide for heat spreading.

BRIEF DESCRIPTION OF THE DRAWINGS

The embodiments of the present disclosure are illustrated by way of example and not limited by the accompanying figures, in which like references indicate similar elements, and in which:

FIG. 1 is a cross-sectional view of a system having wirebonded assemblages according to one embodiment of the present disclosure;

FIG. 2 is a top view of the wirebonded assemblages of FIG. 1 according to one embodiment of the present disclosure;

Figure 4:
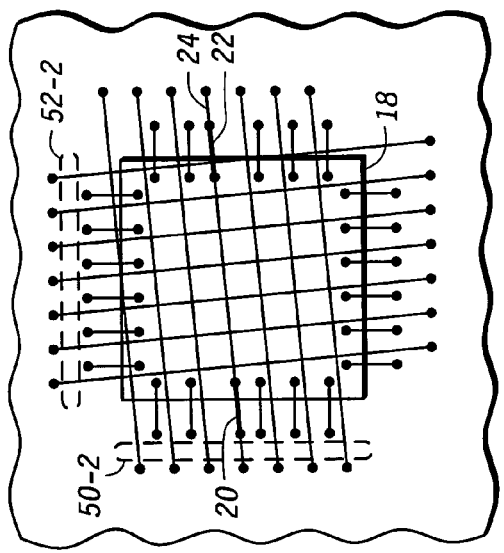
FIG. 4 is a top view of a wirebonded assemblage according to yet another embodiment of the present disclosure.

Skilled artisans appreciate that elements in the figures are illustrated for simplicity and clarity and have not necessarily been drawn to scale. For example, the dimensions of some of the elements in the figures may be exaggerated relative to other elements to help improve an understanding of the embodiments of the present disclosure.

DETAILED DESCRIPTION

FIG. 1 is a cross-sectional view of a system 10 having one or more wirebonded assemblages according to one embodiment of the present disclosure. As shown, first, second and third wirebonded assemblages of system 10 are referred to generally by reference numerals 12, 14, and 16. System 10 includes a substrate 19 with a first circuit portion 18. Circuit portion 18 represents any circuit portion having more than just electrical conductors present therein, such as a die, an integrated circuit element, a resistive element, a capacitive element, an inductive element, or any combinations thereof. As shown, circuit portion 18 represents a wirebonded die attached to a top surface of substrate 19 and including typical wirebond wires 20 and 22 wirebonded between die 18 and substrate 19. Die 18 may have additional typical wirebond wires (not shown). Substrate 19 can include any ceramic, organic, metal lead frame, tape substrate, or the like, as is known in the art.

Wirebonded assemblage 12 includes a plurality of wirebond wires, such as wirebond wire 24 and additional wirebond wires, as will be discussed further herein with reference to FIG. 2. As illustrated in FIG. 1, wirebond wire 24 of wirebonded assemblage 12 is wirebonded at opposite ends thereof in regions proximate an outer edge of die 18. Wirebonded wire 24 also extends over die 18 and wirebond wires 20 and 22, without electrically contacting die 18 or wirebond wires 20 and 22. In this embodiment, wirebonded wire 24 overlays two edges of the circuit portion.

With reference still to FIG. 1, system 10 also includes a second circuit portion 26. Circuit portion 26 represents any circuit portion having more than just electrical conductors present therein, such as a die, an integrated circuit element, a resistive element, a capacitive element, an inductive element, or any combinations thereof. As shown, circuit portion 26 represents a wirebonded die attached to a top surface of substrate 19 and including typical wirebond wires 28 and 30 wirebonded between die 26 and substrate 19. Die 26 may have additional typical wirebond wires (not shown).

Wirebonded assemblage 14 includes a plurality of wirebond wires, such as wirebond wires 32 and 34, and additional wirebond wires, as will be discussed further herein with reference to FIG. 2. As illustrated in FIG. 1, wirebond wires 32 and 34 of wirebonded assemblage 14 are wirebonded between a top portion of die 26 and substrate 19 in regions proximate outer edges of die 26. Wirebonded wires 32 and 34 extend over wirebond wires 28 and 30, respectively, without electrically contacting wirebond wires 28 and 30. In some applications, wirebonded wires 32 and 34 may electrically contact a specific subset of the plurality of wirebond wires 28 and 30 at a predetermined voltage level, for example wires 28 and/or 30 at ground potential, to improve circuit layout or performance.

System 10 further includes a third circuit portion 44. Circuit portion 44 represents any circuit portion having more than just electrical conductors present therein, such as a die, an integrated circuit element, a resistive element, a capacitive element, an inductive element, or any combinations thereof. As shown, circuit portion 44 represents a wirebonded die attached to a top surface of substrate 19 and including typical wirebond wires 38 and 40 wirebonded between die 36 and substrate 19. Die 36 may have additional typical wirebond wires (not shown).

Wirebonded assemblage 16 includes a plurality of wirebond wires, such as wirebond wires 42 and 44, and additional wirebond wires, as will be discussed further herein with reference to FIG. 2. As illustrated in FIG. 1, wirebond wire 42 of wirebonded assemblage 16 is wirebonded between a top portion of die 36 and substrate 19 in a region proximate an outer edge of die 36. Wirebonded wire 42 also extends over wirebond wires 38 without electrically contacting wirebond wire 38. As further illustrated in FIG. 1, wirebond wire 44 of wirebonded assemblage 16 is wirebonded exclusively on a top portion of die 36 in a desired region. Wirebonded wire 44 extends over the surface of die 36 without electrically contacting the underlying region of die 36, except at points of attachment.

While FIG. 1 illustrates three wirebonded assemblages, system 10 may represent any system or combination of systems having one or more wirebonded assemblages as discussed herein.

FIG. 2 is a top view of the wirebonded assemblages of FIG. 1 according to one embodiment of the present disclosure. As discussed, wirebonded assemblage 12 includes a plurality of wirebond wires, such as a first plurality of wirebond wires 50 and a second plurality of wirebond wires 52 arranged perpendicular to wirebond wires 50. Wirebond wire 24 of FIG. 1 is included within the plurality of wirebond wires 50. As illustrated, wirebond wires 50 of wirebonded assemblage 12 are wirebonded at opposite ends thereof in regions proximate a respective outer edge of die 18, for example, as indicated by reference numerals 54 and 56. In addition, wirebond wires 52 are wirebonded at opposite ends thereof in regions proximate a respective outer edge of die 18, for example, as indicated by reference numerals 58 and 60. In this embodiment, wirebonded wires 50 and 52 extend over die 18 and wirebond wires 20 and 22, without electrically contacting die 18 or wirebond wires 20 and 22. Furthermore, a portion of the first plurality of wirebond wires 50 may or may not be in electrical contact with bond wires of the second plurality of bond wires 52, according to the requirements of a particular shielding application.

Further as discussed with respect to FIG. 1, wirebonded assemblage 14 includes a plurality of wirebond wires, such as first and second pluralities of wirebond wires 62 and 64. Wirebond wires 32 and 34 of FIG. 1 are included within the first plurality of wirebond wires 62. As illustrated, wirebond wires 62 of wirebonded assemblage 14 are wirebonded between a top portion of die 26 and substrate 19 in regions proximate outer edges of die 26. For example, the wirebond wires 62 are disposed in a radial pattern around an outer perimeter of die 26. Wirebonded wires 62 also extend over underlying wirebond wires 28 and 30 without electrically contacting the same. In addition, as illustrated, the second plurality of wirebond wires 64 of wirebonded assemblage 14 are wirebonded at opposite ends thereof in a region proximate one side of an outer edge region of die 26. In this embodiment, wirebonded wires 64 extend over die 26 and wirebond wire 30, without electrically contacting die 26 or wirebond wires 30. Furthermore, a portion of the first plurality of wirebond wires 62 may or may not be in electrical contact with bond wires of the second plurality of bond wires 64, according to the particular requirements of a shielding application.

Still further as discussed with respect to FIG. 1, wirebonded assemblage 16 includes a plurality of wirebond wires, such as first and second pluralities of wirebond wires 66 and 68. Wirebond wire 42 of FIG. 1 is included within the first plurality of wirebond wires 66. As illustrated, wirebond wires 66 of wirebonded assemblage 16 are wirebonded between a top portion of die 36 and substrate 19 in a region proximate one side of an outer edge of die 36. In addition, the wirebond wires 66 are radially disposed in a direction extending from an inner region of die 36 to a region outside an outer perimeter of die 36. Furthermore, wirebonded wires 66 also extend over underlying wirebond wires 38 without electrically contacting the same.

As further illustrated in FIG. 1, the second plurality of wirebond wires 68 of wirebonded assemblage 16 are wirebonded exclusively on a top portion of die 36 in a desired region within an inner perimeter of die 36. Wirebonded wire 44 is included within the plurality of wirebond wires 68. As shown, wirebond wires 68 (for example, wirebond wire 44 in FIG. 1) extend over the surface of die 36 without electrically contacting the underlying region of die 36, except at points of attachment. The particular pattern formed by wirebond wires 68 can include any desired pattern, as discussed herein, and/or according to the particular requirements of a given shielding or heat dissipation design. For example, the wirebond wires 68 are shown in a grid pattern arrangement.

Figure 3:
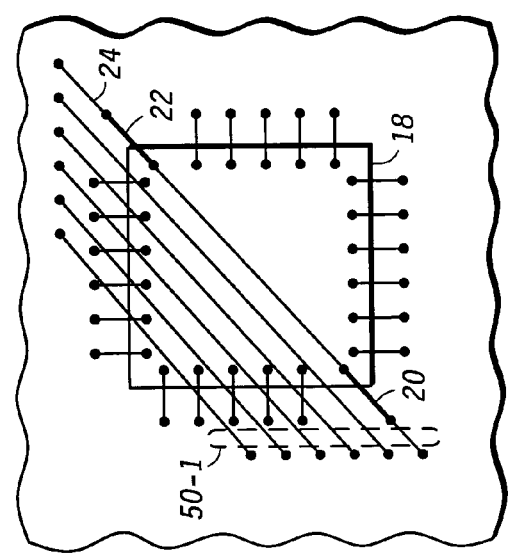
FIG. 3 is a top view of a wirebonded assemblage according to another embodiment of the present disclosure.

FIG. 3 is a top view of a wirebonded assemblage according to another embodiment of the present disclosure. In a variation of the arrangement of wirebonded assemblage 12 shown in FIG. 2, wirebonded assemblage 12-1 includes a plurality of wirebond wires 50-1 arranged in a pattern skewed with respect a direction of the principal edges of the underlying die 18. Wirebond wire 24 of is included within the plurality of wirebond wires 50-1. In addition, as shown, the wirebond wires 50-1 are arranged approximately in a parallel manner. Furthermore, the wirebond wires are wirebonded at opposite ends thereof in regions proximate respective outer edges of die 18. In this embodiment, the wirebonded wires of assemblage 12-1 extend over die 18 and wirebond wires 20 and 22, without electrically contacting underlying die 18 or underlying wirebond wires 20 and 22.

FIG. 4 is a top view of a wirebonded assemblage according to yet another embodiment of the present disclosure. In a variation of the arrangement of wirebonded assemblage 12 shown in FIG. 2, wirebonded assemblage 12-2 includes a first and second plurality of wirebond wires (50-2 and 52-2, respectively) arranged in a pattern approximately perpendicular to one another and also skewed with respect to the underlying die 18. Wirebond wire 24 is included within the plurality of wirebond wires 50-2. As illustrated, the first and second plurality of wirebond wires are wirebonded at opposite ends thereof in regions proximate a respective outer edge of die 18. Furthermore, in this embodiment, the first and second plurality of wirebonded wires extend over die 18 and underlying wirebond wires, for example, 20 and 22, without electrically the same. Moreover, a portion of the first plurality of wirebond wires (50-2) may or may not be in electrical contact with wirebond wires (52-2) of the second plurality of wirebond wires, according to the requirements of a particular shielding application.

Figure 5:
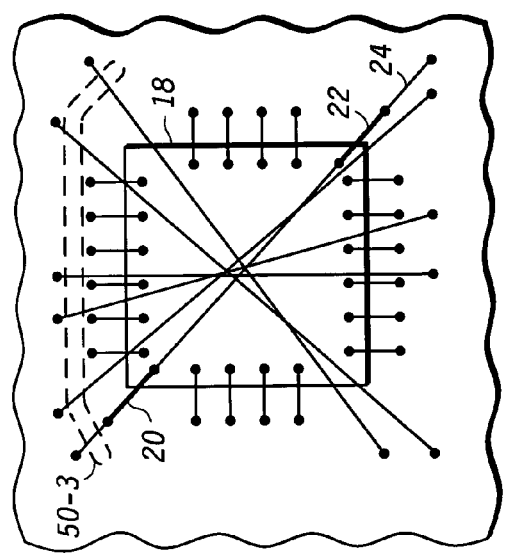
FIG. 5 is a top view of a wirebonded assemblage according to yet another embodiment of the present disclosure.

FIG. 5 is a top view of a wirebonded assemblage according to yet another embodiment of the present disclosure. In another variation of the arrangement of wirebonded assemblage 12 shown in FIG. 2, wirebonded assemblage 12-3 includes a plurality of wirebond wires 50-3 arranged in a random pattern with respect to one another and with respect a direction of the principal edges of the underlying die 18. Wirebond wire 24 is included within the plurality of wirebond wires 50-3. In addition, the wirebond wires 50-3 are wirebonded at opposite ends thereof in regions proximate respective outer edges of die 18. In this embodiment, the wirebonded wires of assemblage 12-3 extend over die 18 and wirebond wires 20 and 22, without electrically contacting underlying die 18 or underlying wirebond wires 20 and 22. Furthermore, a portion of the wirebond wires 50-3 may or may not be in electrical contact with other ones of the wirebond wires 50-3, according to the requirements of a particular shielding application.

Figure 6:
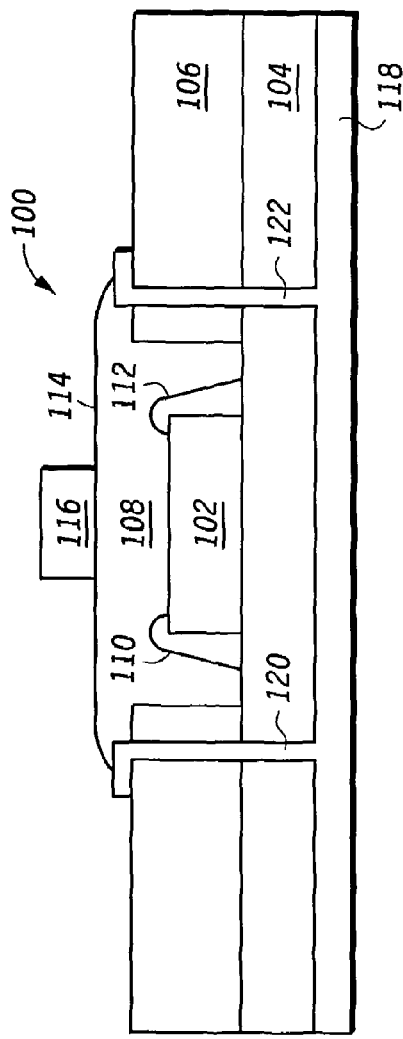
FIG. 6 is a cross-sectional view of a system apparatus having a wirebonded assemblage according to another embodiment of the present disclosure.

FIG. 6 is a cross-sectional view of a system apparatus having a wirebonded assemblage 100 according to another embodiment of the present disclosure. Wirebonded assemblage 100 includes a die 102 mounted on substrate 104 and further having an overlayer 106. Overlayer 106 includes, for example, an insulating layer, a second substrate, or the like, overlying first substrate 104. Overlayer 106 further includes a trench or cavity 108 disposed within the overlayer. Die 102 is electrically coupled to conductors (not shown) within substrate 104 via typical bondwires 110 and 112.

Wirebonded assemblage 100 further includes a plurality of wirebond wires 114 extending over trench or cavity 108 and being coupled at opposite ends thereof in a region proximate an outer perimeter of trench or cavity 108. In one embodiment, a second circuit portion 116 is attached to a top surface of wirebonded assemblage 100, and in particular, to the wirebond wires 114 of assemblage 100.

One or more of circuit portions 102 and 116 can include, for example, a circuit portion that contains more than electrical conductors. That is, in one embodiment, the circuit portion comprises at least one of an active component and a passive component. In another embodiment, the circuit portion comprises at least a portion of an integrated circuit. In another embodiment, the circuit portion also includes a non-linear geometry. For example, the circuit portion can be located within a cavity of a substrate. In yet a further embodiment, the circuit portion comprises a first and a second circuit portion, the second circuit portion overlying the wirebonded wires of a wirebonded assemblage. In one embodiment, the second circuit portion electrically couples to the wirebonded assemblage.

Further with respect to FIG. 6, wirebonded assemblage 100 includes a conductive layer 118, for example, the conductive layer being adapted to function as a grounded backplane or the like. In addition, conductive vias (120, 122) are provided, the conductive vias extending between the backplane 118 and a top surface of layer 106. Moreover, as shown, wirebonded wire 114 of wirebonded assemblage 100 extends between pads on the top surface of layer 106, the pads corresponding to top portions of respective vias (120, 122).

Figure 7:
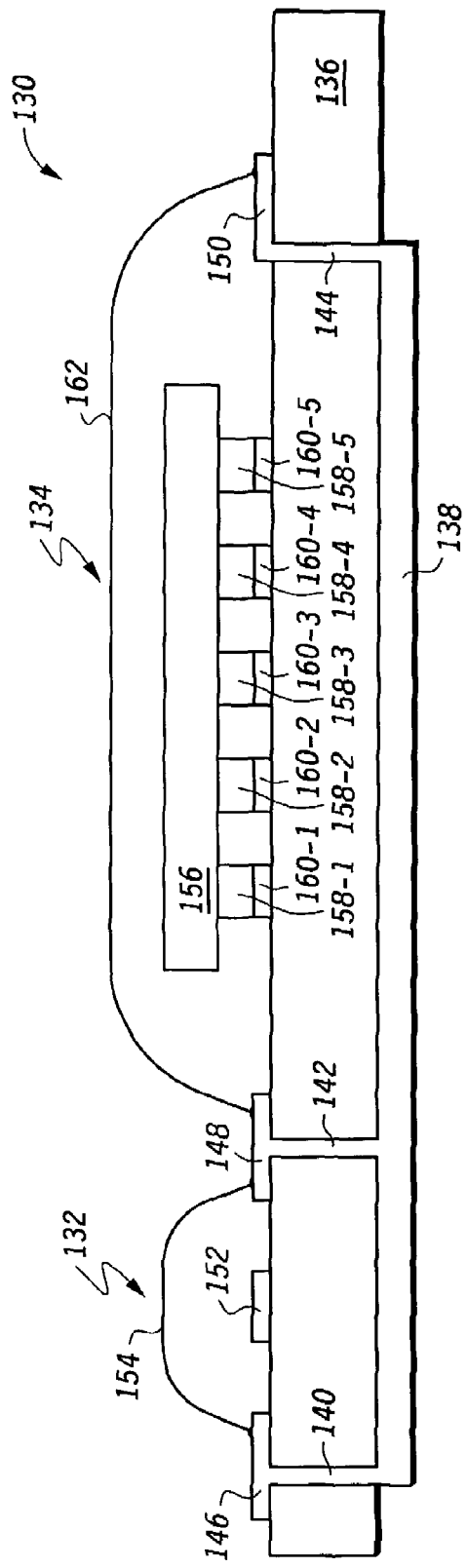
FIG. 7 is a cross-sectional view of a system having a wirebonded assemblage according to yet another embodiment of the present disclosure.

FIG. 7 is a cross-sectional view of a system 130 having wirebonded assemblages (132, 134) according to yet another embodiment of the present disclosure. System 130 includes substrate 136 with a conductive backplane 138 disposed on an underside thereof. The conductive backplane 138 can include a grounded backplane or a backplane disposed at a desired voltage level substantially similar to that of the wirebonded assemblages (132, 134). Conductive vias (140, 142, 144) couple to and extend between the conductive backplane 138 and a top surface of substrate 136, terminating at conductive pads or regions 146, 148, and 150, respectively. Note that while the embodiment of FIG. 7 shows conductive layer 138 as a backplane, such a layer could also include any layer of the substrate, and not be limited only to the bottom layer. For example, the ground plane in a substrate might include a central layer; however, it could also be on any layer, including a top layer.

In this embodiment of FIG. 7, a circuit portion 152 is disposed on a top surface of substrate 136. Wire bonded assemblage 132 includes a plurality of wirebonded wires, illustrated by the single wire bonded wire 154 extending between pads 146 and 148, the plurality of wirebonded wires being similar to those of the various embodiments as discussed herein above. Furthermore, a circuit portion 156 is disposed on a top surface of substrate 136. In one embodiment, circuit portion 156 includes a flip chip with bond pads 158 (indicated by reference numerals 158-1–158-5) and metal attachment bumps 160 (indicated by reference numerals 160-1–160-5). Metal attachment bumps can include any suitable attachment, such as, conductive adhesive, anisotropic conductive tape, and the like. Wire bonded assemblage 134 includes a plurality of wirebonded wires, illustrated by the single wire bonded wire 162 extending between pads 148 and 150, the plurality of wirebonded wires being similar to those of the various embodiments as discussed herein above.

According to the embodiments of the present disclosure, the wirebonded assemblage allows shielding for small geometries inside of a package rather than being confined only to an outside of a package. The present embodiments also allow for constructing a shield around, as well as between, portions of a single package, die or module. The embodiments further allow for constructing a wirebonded assemblage around an area of a module with height variation. Still further, wirebonding is generally readily available at semiconductor packaging assembly sites; thus, the embodiments of the present disclosure can be easily implemented with very low cost.

According to another embodiment, the wirebonded assemblage method includes using wirebonds to construct a full or partial cage around a die or around sensitive areas of a circuit on the die or substrate. Shielding requirements of a particular application may not necessitate 100% shielding; however, a lesser percentage of shielding may be sufficient, for example, 20%, 50%, 90%, etc. as may be required for a given shielding application. Shielding can include electromagnetic shielding. Furthermore, shielding may include heat spreading for dissipation of heat generated by the circuit portion being shielded or in its surroundings.

Portions of the wirebonded assemblage could also be coupled to ground potential or another potential for a desired shielding effectiveness. In one application, the wirebonded assemblage is grounded, that is, connected to ground potential, for greatest effectiveness. Additional variations can include: use of wire bondable surfaces over chip-passivation, such as gold, aluminum, copper, or other surface to which wire bonds can be attached. These and related types of technology would allow for greater flexibility in the location of wirebonds on the die surface and the partial shielding of a die.

Another application uses tape automated bonding instead of or in combination with wire bonds.

Still another application includes use of insulated wire technology to eliminate any electrical shorting concerns. Still further, the wirebonded assemblage technology can be used in conjunction with a via "cage" in a substrate to provide electromagnetic shielding, as well as heat spreading, in the substrate.

The embodiments of the present disclosure include the use of wirebonds to construct an electromagnetic shielding structure internal to an IC package. One illustrative application for the wirebonded assemblage of the present disclosure includes RF modules or high speed digital wirebond products in ball grid array (BGA) or land grid array (LGA) type of technology. Leadframe packaging technology can also be used, with addition of ground leads or use of wirebonds to a grounded die pad. The embodiments of the present disclosure provide most benefit to products which need shielding internal to a package, that is, isolation of portions of the total product. The wirebonded assemblage technology of the present embodiments can also replace the external can-type shields for size reduction and final printed circuit (PC) board assembly step reduction in a phone, radio, computer, or other end-use applications.

A system according to one embodiment of the present disclosure includes a circuit portion and a wirebonded assemblage overlying the circuit portion. The wirebonded assemblage includes a plurality of wirebonded wires. In one embodiment, the plurality of wirebonded wires comprise at least 5 wirebonded wires. Each of the plurality of wirebonded wires are electrically coupled. For example, the plurality of wirebonded wires can be electrically coupled to one another or to desired ones of the plurality of wirebonded wires. At least one of the plurality of wirebonded wires is coupled to a predetermined voltage level. In one embodiment, the predetermined voltage level is approximately ground potential.

In addition to the wirebonded assemblage providing electrical shielding for the circuit portion, the wirebonded assemblage can also provide heat spreading for the circuit portion.

Still further, according to yet another embodiment, at least one of the plurality of wirebonded wires is not wirebonded to the circuit portion. The system may further include a second plurality of wirebonded wires electrically coupled to the circuit portion for communicating electrical signals. In another embodiment, a first one of the plurality of wirebonded wires is neither parallel nor perpendicular to a second one of the plurality of wirebonded wires. Yet still further, the system includes a conductive layer underlying the circuit portion, wherein the conductive layer is electrically coupled to the wirebonded assemblage, further to encapsulate the circuit portion.

In another embodiment, a method for forming a wirebonded assemblage comprises providing a circuit portion having at least one of an active component and a passive component. A plurality of wirebonded wires overlie the least one of the active component and the passive component. The plurality of wirebonded wires electrically couple to one another of the plurality of wirebonded wires.

Accordingly, the plurality of wirebonded wires are configured for electrically shielding the least one of the active component and the passive component. In such an embodiment, an attachment point for a first end of each of the plurality of wirebonded wires overlies an active area of the circuit portion. In one embodiment, the method applies also to a circuit portion comprising an integrated circuit. In the latter instance, at least one of the plurality of wirebonded wires overlies at least two edges of the circuit portion.

In another embodiment of the present disclosure, a system comprises a circuit portion, the circuit portion containing more than just electrical conductors. The system further includes a first wirebonded wire, overlying any two edges of the circuit portion, and a second wirebonded wire, overlying any two edges of the circuit portion. In this embodiment, the first wirebonded wire and the second wirebonded wire are electrically coupled, further wherein the first wirebonded wire and the second wirebonded wire are used to provide electrical shielding for the circuit portion. In addition, the circuit portion can comprise an integrated circuit.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements by may include other elements not expressly listed or inherent to such process, method, article, or apparatus.

The invention claimed is:

1. A system, comprising:
   a circuit portion, containing more than electrical conductors; and
   a wirebonded assemblage, overlying the circuit portion,
   wherein the wirebonded assemblage comprises a plurality of wirebonded wires,
   wherein each of the plurality of wirebonded wires are electrically coupled,
   wherein the wirebonded assemblage provides electrical shielding for the circuit portion, and
   wherein a first one of the plurality of wirebonded wires is neither parallel nor perpendicular to a second one of the plurality of wirebonded wires.

2. A system as in claim 1, wherein the circuit portion comprises at least one of an active component and a passive component.

3. A system as in claim 1, wherein the circuit portion comprises at least a portion of an integrated circuit.

4. A system as in claim 1, wherein the plurality of wirebonded wires comprise at least five wirebonded wires.

5. A system as in claim 1, wherein the circuit portion has a non-linear geometry.

6. A system as in claim 1, wherein the circuit portion is located in a cavity of a substrate.

7. A system as in claim 1, wherein the wirebonded assemblage provides heat spreading for the circuit portion.

8. A system as in claim 1, wherein at least one of the plurality of wirebonded wires is coupled to a predetermined voltage level.

9. A system as in claim 8, wherein the predetermined voltage level is approximately ground.

10. A system as in claim 1, further comprising:
    a second circuit portion, overlying the wirebonded assemblage.

11. A system as in claim 10, wherein the second circuit portion is electrically coupled to the wirebonded assemblage.

12. A system as in claim 1, wherein at least one of the plurality of wirebonded wires is not wirebonded to the circuit portion.

13. A system as in claim 1, further comprising:
   a second plurality of wirebonded wires electrically coupled to the circuit portion for communicating electrical signals.

14. A system as in claim 1, further comprising:
   a conductive layer underlying the circuit portion, wherein the conductive layer is electrically coupled to the wirebonded assemblage to encapsulate the circuit portion.

15. A method for forming a wirebonded assemblage, comprising:
   providing a circuit portion having at least one of an active component and a passive component;
   wirebonding a plurality of wirebonded wires overlying the least one of the active component and the passive component;
   electrically coupling the plurality of wirebonded wires; and
   electrically shielding the least one of the active component and the passive component using the plurality of wirebonded wires.

16. A method as in claims 15, wherein an attachment point for a first end of each of the plurality of wirebonded wires is overlying an active area of the circuit portion.

17. A system as in claim 15, wherein the circuit portion comprises an integrated circuit and wherein at least one of the plurality of wirebonded wires overlies at least two edges of the circuit portion.

18. A system, comprising:
   a circuit portion, containing more than electrical conductors;
   a first plurality of wirebonded wires, overlying any two edges of the circuit portion; and
   a second plurality of wirebonded wires, overlying any two edges of the circuit portion;
   wherein the first plurality of wirebonded wires and the second plurality of wirebonded wires are electrically coupled, and
   wherein the first plurality of wirebonded wires and the second plurality of wirebonded wires are used to provide electrical shielding for the circuit portion, and
   wherein the first plurality of wirebonded wires is neither parallel nor perpendicular to the second plurality of wirebonded wires.

19. A system as in claim 18, wherein the circuit portion comprises an integrated circuit.

* * * * *